United States Patent
Kinsel et al.

(10) Patent No.: US 11,422,202 B2
(45) Date of Patent: Aug. 23, 2022

(54) OVERLOAD CURRENT DETECTION IN A CIRCUIT INTERRUPTING DEVICE

(71) Applicant: Siemens Industry, Inc., Alpharetta, GA (US)

(72) Inventors: Hugh T. Kinsel, Sugar Hill, GA (US); Joselito Endozo, Dacula, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 144 days.

(21) Appl. No.: 16/990,605

(22) Filed: Aug. 11, 2020

(65) Prior Publication Data

US 2022/0050145 A1    Feb. 17, 2022

(51) Int. Cl.
| | |
|---|---|
| *H02H 5/00* | (2006.01) |
| *G01R 31/52* | (2020.01) |
| *G01K 7/38* | (2006.01) |
| *G01R 31/12* | (2020.01) |
| *H02H 1/00* | (2006.01) |
| *H02H 3/10* | (2006.01) |
| *H02H 5/04* | (2006.01) |

(52) U.S. Cl.
CPC .............. *G01R 31/52* (2020.01); *G01K 7/38* (2013.01); *G01R 31/1272* (2013.01); *H02H 1/0007* (2013.01); *H02H 3/105* (2013.01); *H02H 5/048* (2013.01)

(58) Field of Classification Search
CPC ...... H02H 5/048; H02H 3/105; H02H 1/0007; G01R 31/52; G01R 31/127; G01K 7/38
See application file for complete search history.

(56) References Cited

U.S. PATENT DOCUMENTS

| | | | | |
|---|---|---|---|---|
| 2015/0333499 | A1* | 11/2015 | Oppenheimer | H02H 9/042 29/610.1 |
| 2019/0096598 | A1 | 3/2019 | Schmalz et al. | |

FOREIGN PATENT DOCUMENTS

| | | | | |
|---|---|---|---|---|
| CA | 2320251 A1 * | 6/2000 | ............. | H01H 83/20 |
| EP | 0252869 A2 | 1/1988 | | |
| EP | 2595169 A1 * | 5/2013 | ............. | H01H 71/14 |
| FR | 3023057 A1 | 1/2016 | | |

(Continued)

OTHER PUBLICATIONS

TRS Thermal Reed Switch, KEMET Electronics Corporation, SE0201_ TRS • Oct. 29, 2018, pp. 1-17.

*Primary Examiner* — Harry R Behm

(57) ABSTRACT

A circuit interrupting device with overload current detection is provided. It comprises a hot conductor, a main contactor and a first electromagnetic device configured to remove power from an electrical circuit when overload current exceeds a predetermined % of a rated load current. It further comprises a section of conductor that generates heat and a thermal overload current detection mechanism including a temperature sensing switch having contacts. The temperature sensing switch closes the contacts when a temperature reaches a predefined temperature threshold corresponding to an overload current, in which case the temperature sensing switch electrically couples power to a second electromagnet which is disposed across the hot conductor and a connection to a neutral conductor. The energized second electromagnet generates a magnetic force capable of moving an armature that unlatches the latch releasing the spring to open the main contactor removing power from the electrical circuit.

20 Claims, 8 Drawing Sheets

(56) References Cited

FOREIGN PATENT DOCUMENTS

| JP | H0614501 | A | * | 1/1994 |
| JP | 2001201405 | A | * | 7/2001 |
| JP | H07295845 | A | * | 11/2010 |
| JP | 2016136477 | A | * | 7/2016 |
| KR | 19980065978 | | * | 12/1998 |

\* cited by examiner

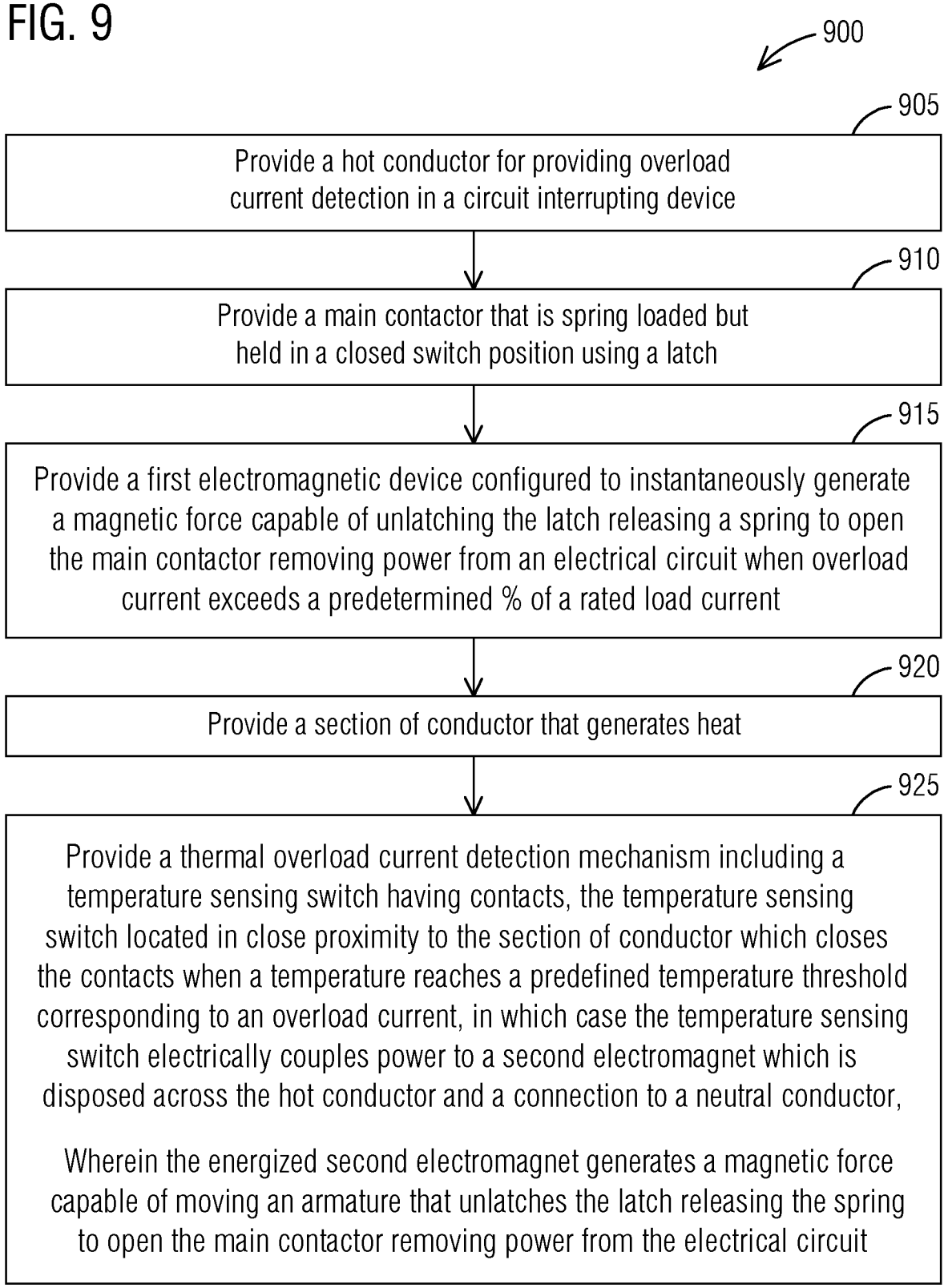

OVERLOAD CURRENT DETECTION IN A CIRCUIT INTERRUPTING DEVICE

BACKGROUND

1. Field

Aspects of the present invention generally relate to overload current detection in a circuit interrupting device.

2. Description of the Related Art

Electrical power is distributed to loads throughout buildings using insulated conductors of different sizes appropriate for the amplitude of current being delivered to the load. The amount of current for continuous safe operation for a particular wire gage size is known as a rated current. If the rated current is exceeded, then the conductor will overheat to a point that the insulation melts resulting in hazardous conditions of electrical shock due to exposed voltage potential energy and of flame ignition due to exposed heat energy. Initially fuses were implemented to prevent these hazardous conditions resulting from overloading the electrical circuit. Fuses were eventually replaced by circuit breakers which function as resettable switches. The circuit breaker typically has a robust main contactor that is spring loaded but held in a closed switch position using a latch. For really high overload current situations greater than approximately 800% to 1000% of the rated current on an electrical circuit, the overload current itself is used to generate a magnetic force to unlatch the latch releasing a spring to open the contactor switch removing power from the electrical circuit.

For overload current situations greater than 135% but less than approximately 800% to 1000%, a bimetallic device in series with the electrical current is situated near the latch such that heat generated by the overload current causes the bimetallic device to warp generating a force to unlatch the latch releasing a spring to open the contactor switch removing power from the electrical circuit.

The utilization of a bimetallic device presents several problems. The amount of displacement achieved from warping of the bimetallic device is very small requiring a high degree of precision. The amount of displacement of the bimetallic device varies substantially from part to part requiring calibration to bias the disposition of the bimetallic device. This especially becomes problematic when mass producing circuit breakers that are being sold commercially. After assembly of the circuit breaker, the disposition of the bimetallic device is initially calibrated by adjusting to a typical setting known to produce an optimum first pass test yield percentage of around 70%. It can take up to 1 minute to test the trip time of a circuit breaker. The disposition of the bimetallic device in nonconforming units are readjusted based on the previous test time result. The readjusted units are retested. The nonconforming units are readjusted one more time and retested. Any nonconforming units after a third round of testing is disassembled and the bimetallic device and assembly is scrapped. Typical total yield after three rounds of testing is approximately 85%. This is a very time consuming, inefficient, costly process that still results in approximately 15 percent nonconforming units. And test time and cost really add up when mass producing millions of units per year.

There has not been a simple alternative solution that has high accuracy without adding electronic sensors, amplifiers, and potentially a microprocessor for overcurrent-time calculations, and an electronic ac-dc adaptor power supply to provide power to the electronics.

Therefore, there is a need for providing an alternative method and apparatus to a bimetallic device.

SUMMARY

Briefly described, aspects of the present invention relate to overload current detection in a circuit interrupting device. This invention solves the problem by providing an alternative method and apparatus to the bimetallic device that monitors the temperature of a section of a conductor internal to a circuit breaker and generates a force to unlatch a latch releasing a spring to open a contactor switch removing power from the electrical circuit, and does so at a more precise temperature that is repeatable from unit to unit in mass production. The invention utilizes a new soft magnetic material called Thermorite® developed by Kemet. The magnetic permeability versus temperature characteristic of Thermorite® exhibits a very sharp drop in magnetic permeability at its Curie point. Moreover, Kemet has commercially made available a family of Thermal Reed Switches utilizing Thermorite® technology that have fast switching response and are accurate to within ±2.5° C. The advantage of this invention is that calibration of a thermal overload current detection mechanism of circuit breakers is not necessary. The highly inefficient and costly iterative process of calibrating a bimetallic overload current detection mechanism is eliminated, along with wasted material that is scrapped due to reworking circuit breakers that nonconformed, thus saving precious time and money during mass production of circuit breakers. The cost savings, improvement in test process, efficiency, and factory line throughput more than offset the cost of adding a Thermal Reed Switch and a second electromagnet. In the case of an electronic circuit breaker for ground fault detection and/or arc fault detection, the second electromagnet already exists as a trip mechanism that is activated upon detection of a fault. So, the only additional cost is the Thermal Reed Switch.

In accordance with one illustrative embodiment of the present invention, a circuit interrupting device is provided. It comprises a hot conductor, a main contactor that is spring loaded but held in a closed switch position using a latch and a first electromagnetic device configured to instantaneously generate a magnetic force capable of unlatching the latch releasing a spring to open the main contactor removing power from an electrical circuit when overload current exceeds a predetermined % of a rated load current. It further comprises a section of conductor that generates heat and a thermal overload current detection mechanism including a temperature sensing switch having contacts. The temperature sensing switch is located in close proximity to the section of conductor which closes the contacts when a temperature reaches a predefined temperature threshold corresponding to an overload current, in which case the temperature sensing switch electrically couples power to a second electromagnet which is disposed across the hot conductor and a connection to a neutral conductor. The energized second electromagnet generates a magnetic force capable of moving an armature that unlatches the latch releasing the spring to open the main contactor removing power from the electrical circuit.

In accordance with one illustrative embodiment of the present invention, a method is provided for providing overload current detection in a circuit interrupting device. The method comprises providing a hot conductor, providing a main contactor that is spring loaded but held in a closed switch position using a latch and providing a first electromagnetic device configured to instantaneously generate a magnetic force capable of unlatching the latch releasing a spring to open the main contactor removing power from an electrical circuit when overload current exceeds a predetermined % of a rated load current. The method further comprises providing a section of conductor that generates heat and providing a thermal overload current detection mechanism including a temperature sensing switch having contacts. The temperature sensing switch is located in close proximity to the section of conductor which closes the contacts when a temperature reaches a predefined temperature threshold corresponding to an overload current, in which case the temperature sensing switch electrically couples power to a second electromagnet which is disposed across the hot conductor and a connection to a neutral conductor. The energized second electromagnet generates a magnetic force capable of moving an armature that unlatches the latch releasing the spring to open the main contactor removing power from the electrical circuit.

BRIEF DESCRIPTION OF THE DRAWINGS

FIG. 9 illustrates a schematic view of a flow chart of a method for providing overload current detection in a circuit interrupting device in accordance with an exemplary embodiment of the present invention.

DETAILED DESCRIPTION

Figure 1:
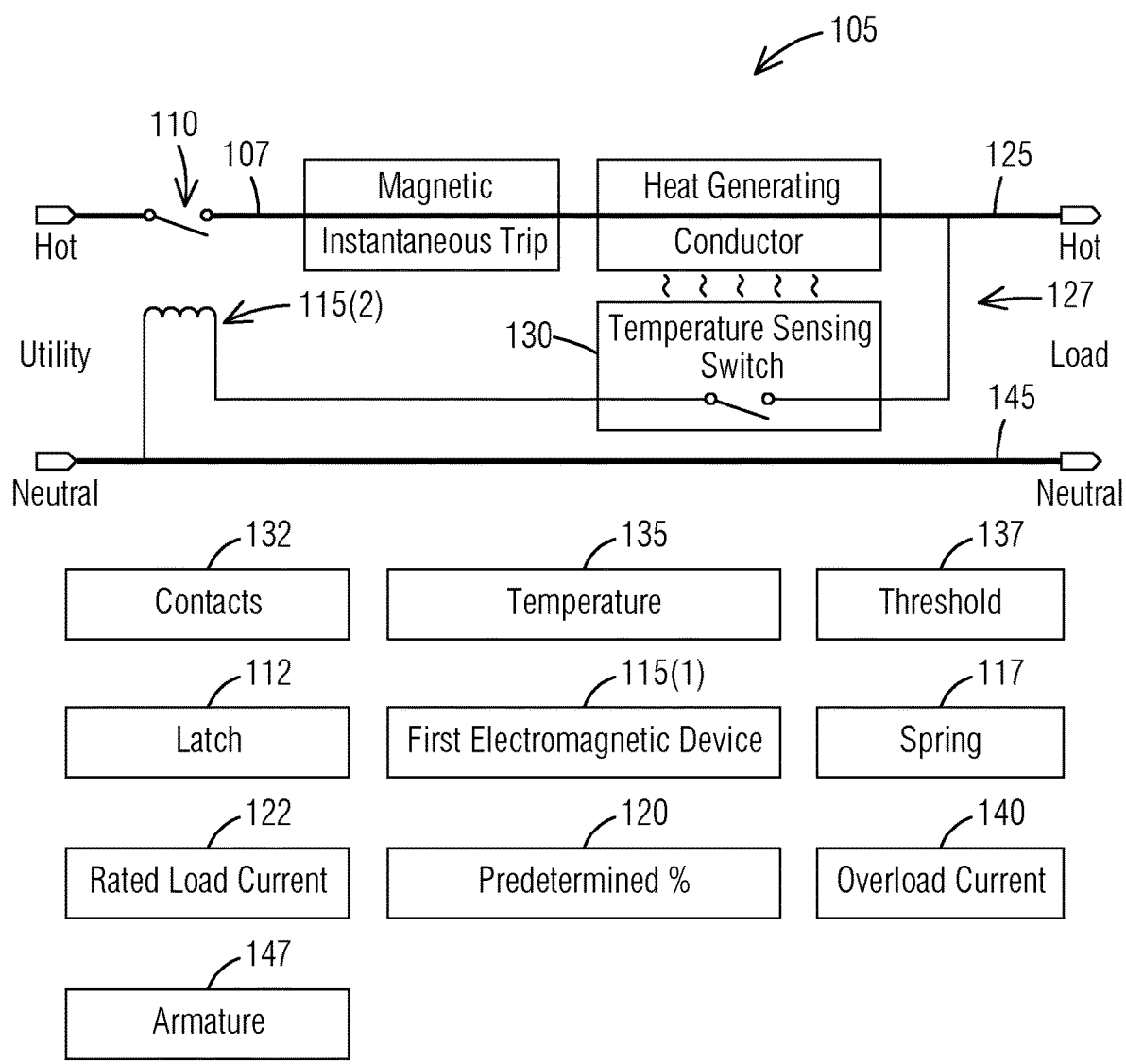
FIG. 1 illustrates a circuit interrupting device without a bimetallic overload current detection mechanism in accordance with an exemplary embodiment of the present invention.

To facilitate an understanding of embodiments, principles, and features of the present invention, they are explained hereinafter with reference to implementation in illustrative embodiments. In particular, they are described in the context of a circuit interrupting device without a bimetallic overload current detection mechanism. A circuit interrupting device comprises a thermal overload current detection mechanism including a temperature sensing switch. For example, a circuit interrupting device includes a Thermal Reed Switch that utilizes a new soft magnetic material called Thermorite®. The Thermal Reed Switch has a fast switching response and is accurate to within ±2.5° C. The highly inefficient and costly iterative process of calibrating a bimetallic overload current detection mechanism is eliminated, along with wasted material. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the circuit interrupting device according to the present disclosure are described below with reference to FIGS. 1-6 herein. Like reference numerals used in the drawings identify similar or identical elements throughout the several views. The drawings are not necessarily drawn to scale.

Consistent with one embodiment of the present invention, FIG. 1 represents a block diagram of a circuit interrupting device 105 that provides overload current detection in accordance with an exemplary embodiment of the present invention. The circuit interrupting device 105 is without a bimetallic overload current detection mechanism. The circuit interrupting device 105 comprises a hot conductor 107, a main contactor 110 that is spring loaded but held in a closed switch position using a latch 112 and a first electromagnetic device 115(1) configured to instantaneously generate a magnetic force capable of unlatching the latch 112 releasing a spring 117 to open the main contactor 110 removing power from an electrical circuit when overload current exceeds a predetermined % 120 of a rated load current 122. For example, the predetermined % 120 of the rated load current 122 may be 800%. The circuit interrupting device 105 further comprises a section of conductor 125 that generates heat and a thermal overload current detection mechanism 127 including a temperature sensing switch 130 having contacts 132. The temperature sensing switch 130 is located in close proximity to the section of conductor 125 which closes the contacts 132 when a temperature 135 reaches a predefined temperature threshold 137 corresponding to an overload current 140, in which case the temperature sensing switch 130 electrically couples power to a second electromagnet 115(2) which is disposed across the hot conductor 107 and a connection to a neutral conductor 145. When the circuit interrupting device 105 is an electronic circuit breaker for ground fault detection and/or arc fault detection it has the second electromagnet 115(2) built in a trip mechanism which activates upon detection of a fault. The energized second electromagnet 115(2) generates a magnetic force capable of moving an armature 147 that unlatches the latch 112 releasing the spring 117 to open the main contactor 110 removing power from the electrical circuit.

The temperature sensing switch 130 further comprises a soft magnetic material called Thermorite® that has magnetic permeability versus temperature characteristic which exhibits a very sharp drop in magnetic permeability at its Curie point. For example, the circuit interrupting device 105 may include a Thermal Reed Switch that utilizes a new soft magnetic material called Thermorite®. The Thermal Reed Switch has a fast switching response and is accurate to within ±2.5° C. The highly inefficient and costly iterative process of calibrating a bimetallic overload current detection mechanism is eliminated, along with wasted material. In the case of an electronic circuit breaker for ground fault detection and/or arc fault detection, the second electromagnet 115(2) already exists as a trip mechanism that is activated upon detection of a fault. So, the only additional cost is the Thermal Reed Switch.

Calibration of the thermal overload current detection mechanism 127 of the circuit interrupting device 105 is not necessary. However, in a bimetallic device-based design, the amount of displacement of the bimetallic device varies substantially from part to part requiring calibration to bias the disposition of the bimetallic device. This especially becomes problematic when mass producing circuit breakers that are being sold commercially. After assembly of the circuit breaker, the disposition of the bimetallic device is initially calibrated by adjusting to a typical setting known to produce an optimum first pass test yield percentage of around 70%. It can take up to 1 minute to test the trip time of a circuit breaker. The disposition of the bimetallic device in nonconforming units are readjusted based on the previous test time result. The readjusted units are retested. The nonconforming units are readjusted one more time and retested. Any nonconforming units after a third round of testing is disassembled and the bimetallic device and assembly is scrapped. Typical total yield after three rounds of testing is approximately 85%. This is a very time consuming, inefficient, costly process that still results in approximately 15 percent nonconforming units. And test time and cost really add up when mass producing millions of units per year.

The predefined temperature threshold 137 is selected to ensure compliance of safety standard UL489. For the 200 percent calibration test and the 135 percent calibration test which are performed at 25° C. ambient temperature, a 15 A to 30 A rated circuit breaker must trip within 2 minutes while carrying 200 percent of its rated current, and within 1 hour while carrying 135 percent of its rated current. And for the 100 percent calibration test which is performed at 40° C. ambient temperature, the circuit breaker shall not trip while carrying 100 percent of its rated current until its temperatures have stabilized.

Figure 2:
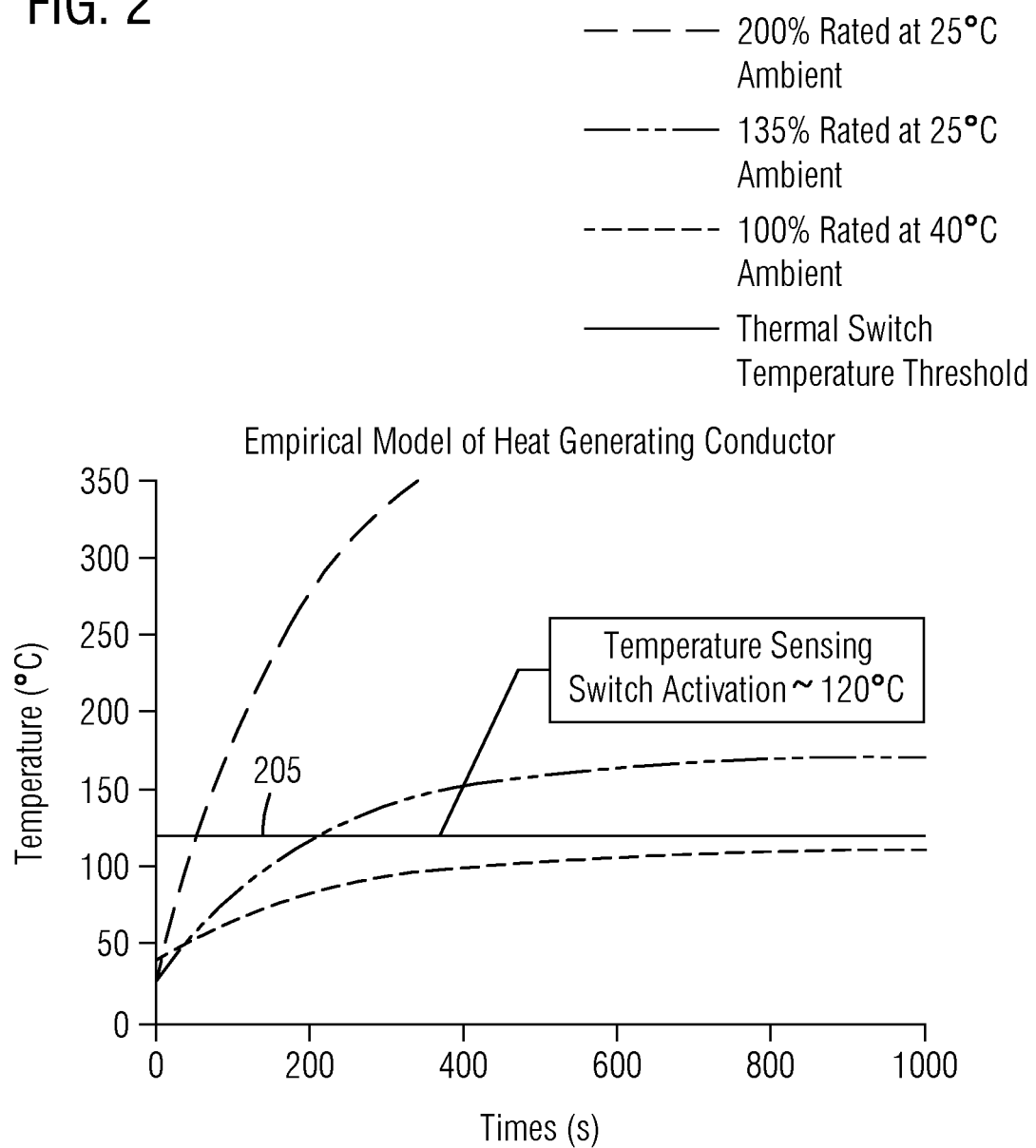
FIG. 2 illustrates an empirical model of temperature vs. time characteristic of a heat generating conductor section of a 20 A rated circuit breaker during the various calibration tests in accordance with an exemplary embodiment of the present invention.

Referring to FIG. 2, it illustrates an empirical model of temperature vs. time characteristic of a heat generating conductor section of a 20 A rated circuit breaker during the various calibration tests in accordance with an exemplary embodiment of the present invention. A predetermined threshold 205 of the temperature sensing switch 130 is set to approximately 120° C. to achieve a trip time of approximately 1 minute while carrying 200 percent of its rated current (25° C. ambient), a trip time of approximately 3.5 minutes while carrying 200 percent of its rated current (25° C. ambient), and to not trip while carrying 100 percent of its rated current (40° C. ambient), which are well within the test limits described in UL489.

Figure 3:
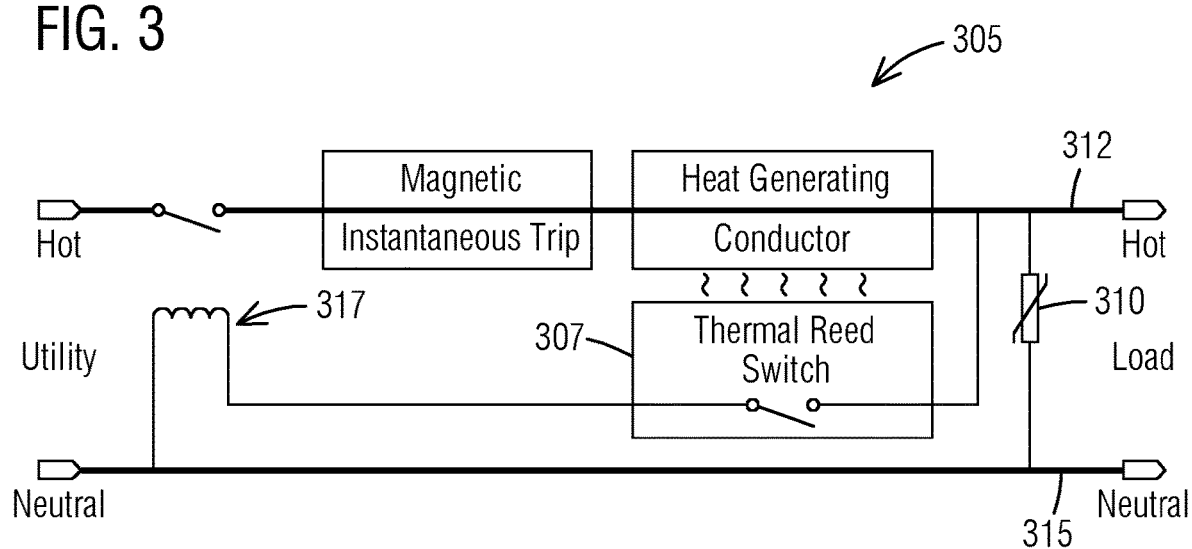
FIG. 3 illustrates a circuit interrupting device with a Thermal Reed Switch in accordance with an exemplary embodiment of the present invention.

Turning now to FIG. 3, it illustrates a circuit interrupting device 305 with a Thermal Reed Switch 307 in accordance with an exemplary embodiment of the present invention. The Thermal Reed Switch 307 utilizes Thermorite® such that it has a fast switching response and is accurate to within ±2.5° C. The circuit interrupting device 305 further comprises an optional Metal Oxide Varistor (MOV) 310 disposed across a hot conductor 312 and a connection to a neutral conductor 315 to protect the Thermal Reed Switch 307 from high voltage surges.

The circuit interrupting device 305 further comprises a second electromagnet 317. If the current required to energize the second electromagnet 317 exceeds a current rating of the Thermal Reed Switch 307, an off-the-shelf Thermal Reed Switch can be utilized to turn on a solid state switch that has a current rating to safely and repeatedly supply the current required to energize the second electromagnet 317.

Suppose the current required to energize the second electromagnet 317 exceeds the current rating of the Thermal Reed Switch 307. Instead of utilizing a custom designed Temperature Sensing Switch or Thermal Reed Switch that has a current rating to safely and repeatedly supply the current required to energize the second electromagnet, an off-the-shelf Thermal Reed Switch can be utilized to turn on a solid state switch that has a current rating to safely and repeatedly supply the current required to energize the second electromagnet 317.

Figure 4:
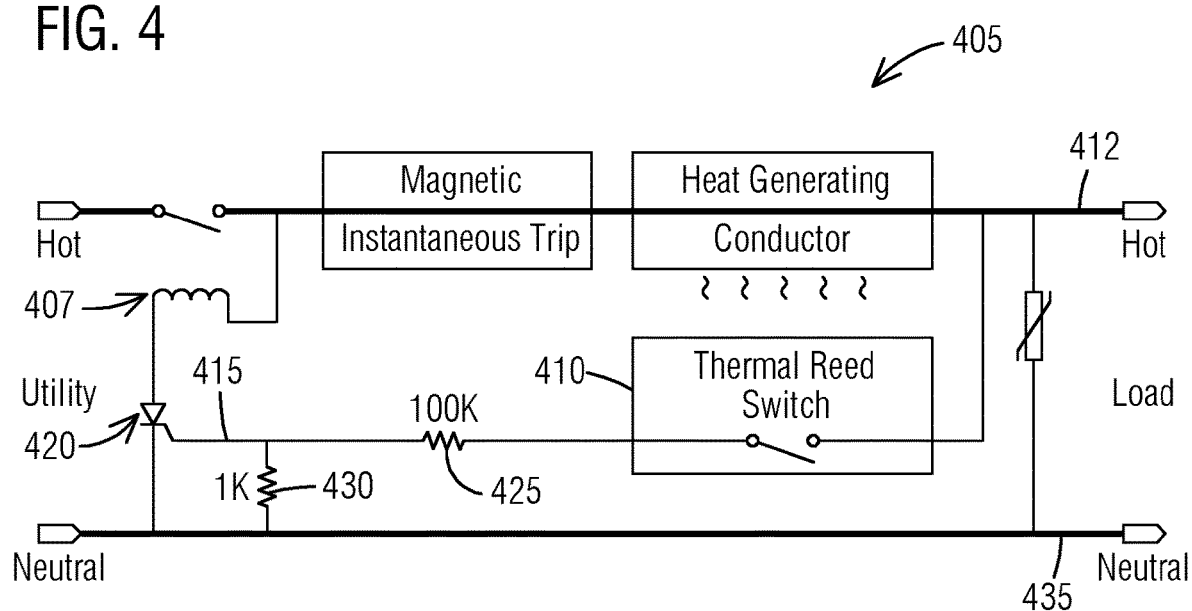
FIG. 4 illustrates a circuit interrupting device where the current required to energize a second electromagnet exceeds the current rating of a Thermal Reed Switch in accordance with an exemplary embodiment of the present invention.

FIG. 4 illustrates a circuit interrupting device 405 where the current required to energize a second electromagnet 407 exceeds the current rating of a Thermal Reed Switch 410 in accordance with an exemplary embodiment of the present invention. The Thermal Reed Switch 410 electrically couples power from a hot conductor 412 to a gate 415 of a Silicone-Controlled Rectifier (SCR) 420 through a resistor divider 422 consisting of a 100K resistor 425 and 1K resister 430 which turns on and energizes the second electromagnet 407 that is disposed across the hot conductor 412 and a connection to a neutral conductor 435 through the SCR 420. The Thermal Reed Switch 410 may be a "make" type or a "break" type configured to enable power to be electrically coupled to the gate 415 of the Silicone-Controlled Rectifier (SCR) 420. The "make" type refers to contacts normally open and closes when a predetermined temperature is reached. The "break" type refers to contacts normally closed and opens when the predetermined temperature is reached.

Figure 5:
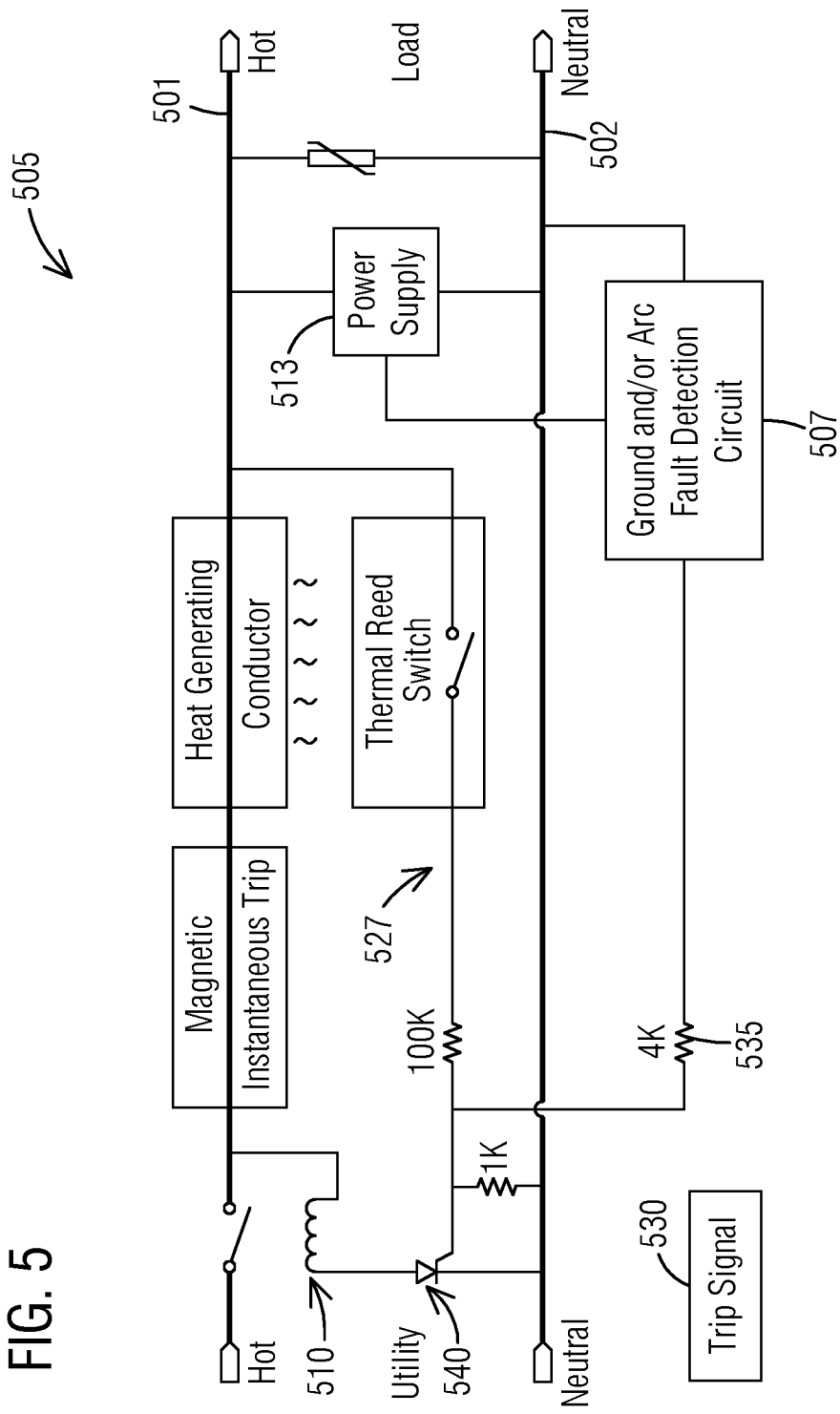
FIG. 5 illustrates a circuit interrupting device that integrates nicely into an electronic ground fault and/or arc fault circuit interrupter to form an additional alternative embodiment.

As seen in FIG. 5, it illustrates a circuit interrupting device 505 that integrates nicely into an electronic ground fault and/or arc fault circuit interrupter to form an additional alternative embodiment. The circuit interrupting device 505 further comprises an electronic ground fault and/or arc fault detection circuit 507 where a second electromagnet 510 and a solid-state switch can be utilized by both a thermal overload current detection mechanism 527 and a ground and/or arc fault trip mechanism.

In this embodiment, a power supply 513 disposed across a hot conductor 501 and a neutral conductor 502 typically converting 120V AC power to 5V DC power, which is supplied to the electronic ground fault and/or arc fault detection circuit 507. Upon detection of a ground fault or arc fault, the electronic ground fault and/or arc fault detection circuit 507 asserts a trip signal 530 that is coupled through a 4K resistor 535 to a gate of a SCR 540, which turns on and energizes the same second electromagnet 510 that it is disposed across a hot conductor 501 and a connection to the neutral conductor 502 through the SCR 540. The energized second electromagnet 510 generates magnetic force capable of moving the armature that unlatches the latch releasing the spring to open the contactor switch removing power from the electrical circuit.

Figure 6:
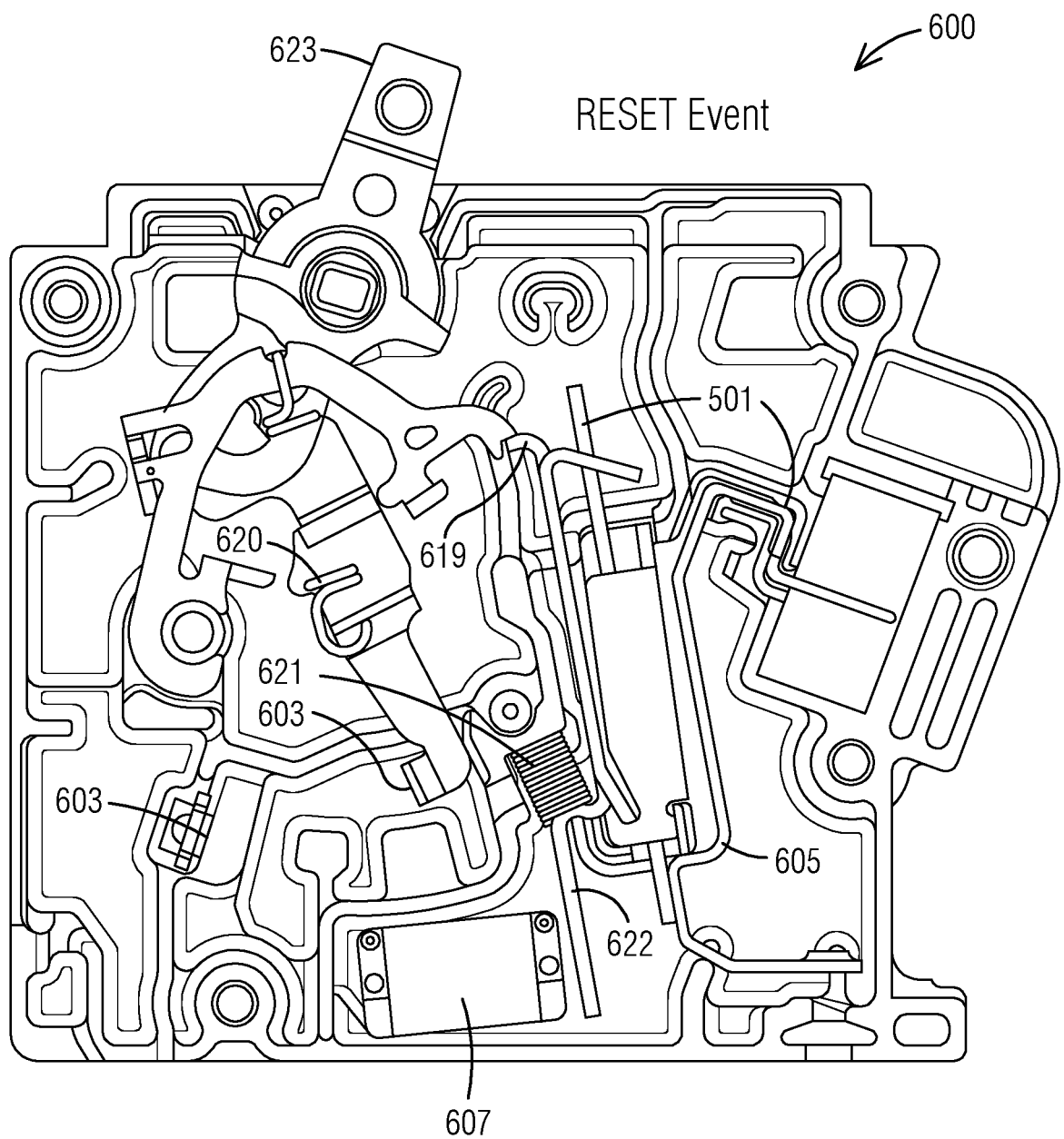
FIGS. 6-8 illustrate a schematic view of a mechanical form of a circuit interrupting device in accordance with an exemplary embodiment of the present invention
Figure 7:
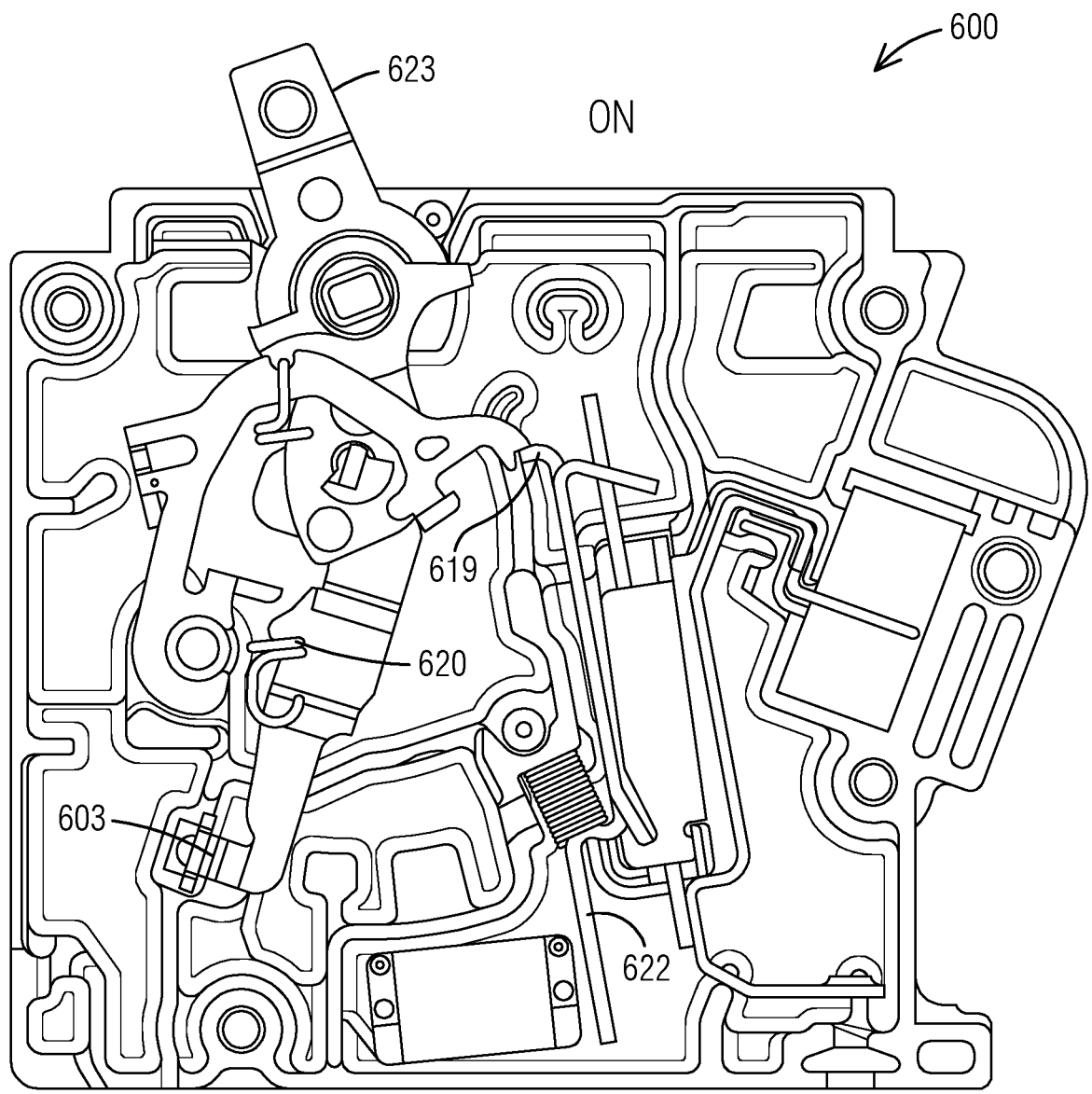
Figure 8:
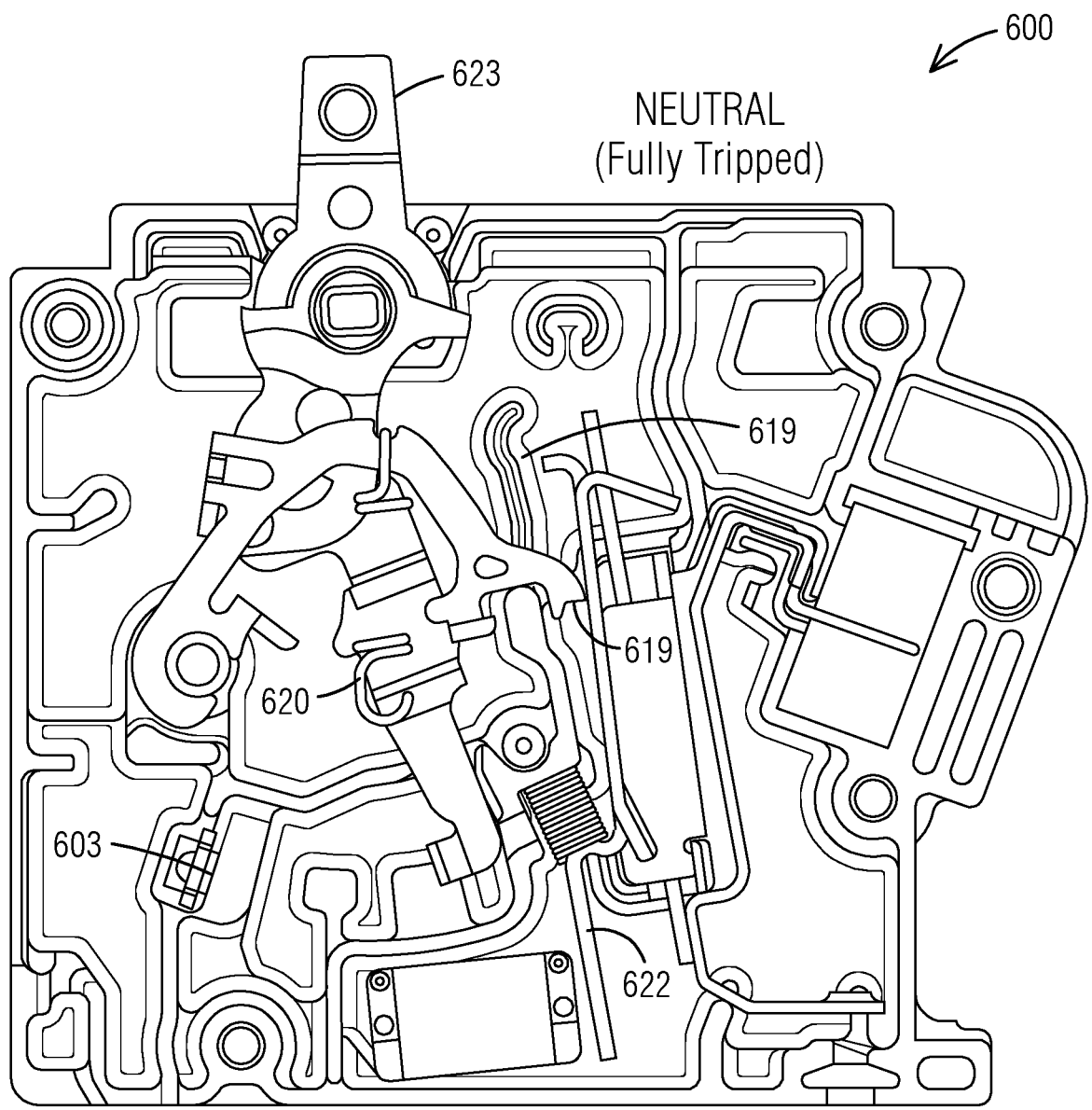

As shown in FIGS. 6-8, they illustrate a schematic view of a mechanical form of a circuit interrupting device 600 in accordance with an exemplary embodiment of the present invention. FIG. 6 shows the embodiment in its mechanical form when the circuit interrupting device 600 is in a "Reset" state where a main contactor 603 is open and a latch 619 is latched loading a spring 620 of the main contactor 603. This is accomplished by moving a handle 623 from a "Tripped" position shown in FIG. 8 to the "Reset" position in FIG. 6. A different spring 621 holds a trip armature 622 in place. FIG. 7 shows the embodiment in its mechanical form when the circuit interrupting device 600 is in an "On" state where the main contactor 603 is closed by moving the handle 623.

FIG. 8 shows the embodiment in its mechanical form when the circuit interrupting device 600 is in a "Tripped" state as a result of a thermal switch in FIG. 1 located in close proximity to a heating conductor 605 that energizes a second electromagnet 607 upon exceeding a predetermined temperature threshold. The energized electromagnet 607 exerts force on the trip armature 622 which unlatches the latch 619 releasing the spring 620. The force of the spring 620 moves the handle 623 to the "Tripped" position and opens the main contactor 603 removing power from the electrical circuit.

In FIG. 9, it illustrates a schematic view of a flow chart of a method 900 for providing overload current detection in the circuit interrupting device 105 in accordance with an exemplary embodiment of the present invention. Reference is made to the elements and features described in FIGS. 1-8. It should be appreciated that some steps are not required to be performed in any particular order, and that some steps are optional.

The method 900 comprises a step 905 of providing a hot conductor. The method 900 further comprises a step 910 of providing a main contactor that is spring loaded but held in a closed switch position using a latch. The method 900 further comprises a step 915 of providing a first electromagnetic device configured to instantaneously generate a magnetic force capable of unlatching the latch releasing a spring to open the main contactor removing power from an electrical circuit when overload current exceeds a predetermined % of a rated load current. The method 900 further comprises a step 920 of providing a section of conductor that generates heat. The method 900 further comprises a step 925 of providing a thermal overload current detection mechanism including a temperature sensing switch having contacts. The temperature sensing switch is located in close proximity to the section of conductor which closes the contacts when a temperature reaches a predefined temperature threshold corresponding to an overload current, in which case the temperature sensing switch electrically couples power to a second electromagnet which is disposed across the hot conductor and a connection to a neutral conductor. The energized second electromagnet generates a magnetic force capable of moving an armature that unlatches the latch releasing the spring to open the main contactor removing power from the electrical circuit.

While a temperature sensing switch based on Thermorite® is described here a range of one or more other types of temperature sensing switch components or other forms of temperature sensing are also contemplated by the present invention. For example, other types of temperature sensing switch components may be implemented based on one or more features presented above without deviating from the spirit of the present invention.

The techniques described herein can be particularly useful for an electronic ground fault and/or arc fault circuit interrupter. While particular embodiments are described in terms of specific ground fault and/or arc fault configuration and specific circuit breakers, the techniques described herein are not limited to such a limited configuration and circuit breakers but can also be used with other configurations and circuit breakers.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A circuit interrupting device, comprising:
   a hot conductor;
   a main contactor that is spring loaded but held in a closed switch position using a latch;
   a first electromagnetic device configured to instantaneously generate a magnetic force capable of unlatching the latch releasing a spring to open the main contactor removing power from an electrical circuit when overload current exceeds a predetermined % of a rated load current;
   a section of conductor that generates heat;
   a thermal overload current detection mechanism including a non-remote-controlled stationary temperature sensing switch having contacts, the temperature sensing switch located in close proximity to the section of conductor which closes the contacts when a temperature reaches a predefined temperature threshold corresponding to an overload current, in which case the temperature sensing switch electrically couples power to a second electromagnet which is disposed across the hot conductor and a connection to a neutral conductor,
   wherein the temperature sensing switch is based solely on a temperature characteristic of a soft magnetic material that loses its magnetic properties at a specific elevated temperature enabling the contacts of the temperature sensing switch to close, and
   wherein the energized second electromagnet generates a magnetic force capable of moving an armature that unlatches the latch releasing the spring to open the main contactor removing power from the electrical circuit.

2. The circuit interrupting device of claim 1, wherein the temperature sensing switch further comprising:
   the soft magnetic material that has magnetic permeability versus temperature characteristic which exhibits a very sharp drop in magnetic permeability at its Curie point.

3. The circuit interrupting device of claim 1, wherein the temperature sensing switch further comprising:
   a Thermal Reed Switch utilizing the soft magnetic material such that it has a fast switching response and is accurate to within ±2.5° C.

4. The circuit interrupting device of claim 3, further comprising:
   an optional Metal Oxide Varistor (MOV) disposed across the hot conductor and a connection to the neutral conductor to protect the Thermal Reed Switch from high voltage surges.

5. The circuit interrupting device of claim 3, wherein if the current required to energize the second electromagnet exceeds a current rating of the Thermal Reed Switch, an off-the-shelf Thermal Reed Switch can be utilized to turn on a solid state switch that has a current rating to safely and repeatedly supply the current required to energize the second electromagnet.

6. The circuit interrupting device of claim 3, wherein where the current required to energize the second electromagnet exceeds a current rating of the Thermal Reed Switch in that the Thermal Reed Switch electrically couples power from the hot conductor to a gate of a Silicone-Controlled Rectifier (SCR) through a resistor divider which turns on and energizes the second electromagnet that is disposed across the hot conductor and a connection to the neutral conductor through the SCR.

7. The circuit interrupting device of claim 6, wherein the Thermal Reed Switch is a "make" type or a "break" type configured to enable power to be electrically coupled to the gate of the Silicone-Controlled Rectifier (SCR),
   wherein the "make" type refers to contacts normally open and closes when a predetermined temperature is reached, and
   wherein the "break" type refers to contacts normally closed and opens when the predetermined temperature is reached.

8. The circuit interrupting device of claim 1, wherein calibration of the thermal overload current detection mechanism of the circuit interrupting device is not necessary.

9. The circuit interrupting device of claim 1, wherein the circuit interrupting device is an electronic circuit breaker for ground fault detection and/or arc fault detection which has the second electromagnet built in a trip mechanism which activates upon detection of a fault.

10. The circuit interrupting device of claim 1, wherein the predefined temperature threshold is selected to ensure compliance of a safety standard UL489 Edition 13, Edition Date: Oct. 24, 2016.

11. The circuit interrupting device of claim 1, further comprising:
    an electronic ground fault and/or arc fault circuit interrupter where the second electromagnet and a solid-state switch can be utilized by both the thermal overload current detection mechanism and a ground and/or arc fault trip mechanism.

12. The circuit interrupting device of claim 1, wherein the predetermined % of the rated load current is 800%.

13. A method for providing overload current detection in a circuit interrupting device, the method comprising:
providing a hot conductor;
providing a main contactor that is spring loaded but held in a closed switch position using a latch;
providing a first electromagnetic device configured to instantaneously generate a magnetic force capable of unlatching the latch releasing a spring to open the main contactor removing power from an electrical circuit when overload current exceeds a predetermined % of a rated load current;
providing a section of conductor that generates heat;
providing a thermal overload current detection mechanism including a non-remote-controlled stationary temperature sensing switch having contacts, the temperature sensing switch located in close proximity to the section of conductor which closes the contacts when a temperature reaches a predefined temperature threshold corresponding to an overload current, in which case the temperature sensing switch electrically couples power to a second electromagnet which is disposed across the hot conductor and a connection to a neutral conductor,
wherein the temperature sensing switch is based solely on a temperature characteristic of a soft magnetic material that loses its magnetic properties at a specific elevated temperature enabling the contacts of the temperature sensing switch to close, and
wherein the energized second electromagnet generates a magnetic force capable of moving an armature that unlatches the latch releasing the spring to open the main contactor removing power from the electrical circuit.

14. The method of claim 13, wherein the temperature sensing switch further comprising:
the soft magnetic material that has magnetic permeability versus temperature characteristic which exhibits a very sharp drop in magnetic permeability at its Curie point.

15. The method of claim 13, wherein the temperature sensing switch further comprising:
a Thermal Reed Switch utilizing the soft magnetic material such that it has a fast switching response and is accurate to within ±2.5° C.

16. The method of claim 15, further comprising:
providing an optional Metal Oxide Varistor (MOV) disposed across the hot conductor and a connection to the neutral conductor to protect the Thermal Reed Switch from high voltage surges.

17. The method of claim 15, wherein if the current required to energize the second electromagnet exceeds a current rating of the Thermal Reed Switch, an off-the-shelf Thermal Reed Switch can be utilized to turn on a solid state switch that has a current rating to safely and repeatedly supply the current required to energize the second electromagnet.

18. The method of claim 15, wherein where the current required to energize the second electromagnet exceeds a current rating of the Thermal Reed Switch in that the Thermal Reed Switch electrically couples power from the hot conductor to a gate of a Silicone-Controlled Rectifier (SCR) through a resistor divider which turns on and energizes the second electromagnet that is disposed across the hot conductor and a connection to the neutral conductor through the SCR.

19. The method of claim 13, wherein calibration of the thermal overload current detection mechanism of the circuit interrupting device is not necessary.

20. The method of claim 13, wherein the circuit interrupting device is an electronic circuit breaker for ground fault detection and/or arc fault detection which has the second electromagnet built in a trip mechanism which activates upon detection of a fault.

* * * * *